(12) United States Patent
Penney et al.

(10) Patent No.: US 7,003,643 B1
(45) Date of Patent: Feb. 21, 2006

(54) BURST COUNTER CONTROLLER AND METHOD IN A MEMORY DEVICE OPERABLE IN A 2-BIT PREFETCH MODE

(75) Inventors: Daniel B. Penney, Wylie, TX (US); Steven So, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 809 days.

(21) Appl. No.: 09/836,593

(22) Filed: Apr. 16, 2001

(51) Int. Cl.
*G06F 12/00* (2006.01)
(52) U.S. Cl. .......................... 711/167; 365/230; 365/4
(58) Field of Classification Search .......... 365/230.03, 365/230.04, 236, 230; 711/217, 219, 167
See application file for complete search history.

(56) References Cited

U.S. PATENT DOCUMENTS

| | | | |
|---|---|---|---|
| 5,077,737 A | 12/1991 | Leger et al. | 371/10.1 |
| 5,802,005 A | 9/1998 | Nakamura et al. | 365/230.03 |
| 6,091,665 A | 7/2000 | Dorney | 365/236 |
| 6,130,853 A | 10/2000 | Wang et al. | 365/230.06 |
| 6,240,047 B1 | 5/2001 | Koelling et al. | 365/233 |
| 6,278,643 B1 | 8/2001 | Penney | 365/200 |
| 6,310,824 B1 * | 10/2001 | Schoniger et al. | 365/233 |
| 6,321,311 B1 | 11/2001 | Kim | 711/157 |
| 6,438,063 B1 | 8/2002 | Lee | 365/230.03 |
| 6,438,066 B1 | 8/2002 | Ooishi et al. | 365/233 |
| 6,442,644 B1 | 8/2002 | Gustavson et al. | 711/105 |
| 6,473,360 B1 | 10/2002 | Ooishi | 365/233 |
| 6,564,343 B1 | 5/2003 | Yamashita | 714/701 |
| 6,618,319 B1 | 9/2003 | Ooishi et al. | 365/233 |
| 6,625,685 B1 | 9/2003 | Cho et al. | 711/5 |
| 6,629,224 B1 | 9/2003 | Suzuki et al. | 711/167 |
| 6,671,787 B1 | 12/2003 | Kanda et al. | 711/167 |
| 6,724,686 B1 | 4/2004 | Ooishi et al. | 365/233 |
| 6,754,126 B1 | 6/2004 | Yamaguchi et al. | 365/222 |
| 6,754,746 B1 | 6/2004 | Leung et al. | 710/100 |
| 6,762,972 B1 | 7/2004 | La | 365/233 |
| 6,771,557 B1 | 8/2004 | Penney | 365/230.06 |
| 6,775,759 B1 | 8/2004 | Janzen | 711/217 |
| 6,788,597 B1 | 9/2004 | Ladner et al. | 365/200 |

* cited by examiner

*Primary Examiner*—Mano Padmanabhan
*Assistant Examiner*—Duc T Doan
(74) *Attorney, Agent, or Firm*—Dorsey & Whitney LLP

(57) ABSTRACT

A burst counter generates all but the least significant bit ("LSB") of a sequence of column addresses in a 2-bit prefetch dynamic random access memory ("DRAM"). The sequence of column addresses is generated by either incrementing or decrementing the burst counter starting from an externally applied starting address. The count direction of the counter is controlled by a counter control circuit that receives the LSB the next to least significant bit ("NLSB") of the starting column address, as well as a signal indicative of the operating mode of the DRAM. In a serial operating mode, the counter control circuit causes the burst counter to increment when the LSB of the starting column address is "0" and to decrement when the LSB of the starting column address is "1". In an interleave operating mode, the counter control circuit causes the burst counter to increment when the NLSB of the starting column address is "0" and to decrement when the NLSB of the starting column address is "1".

24 Claims, 3 Drawing Sheets

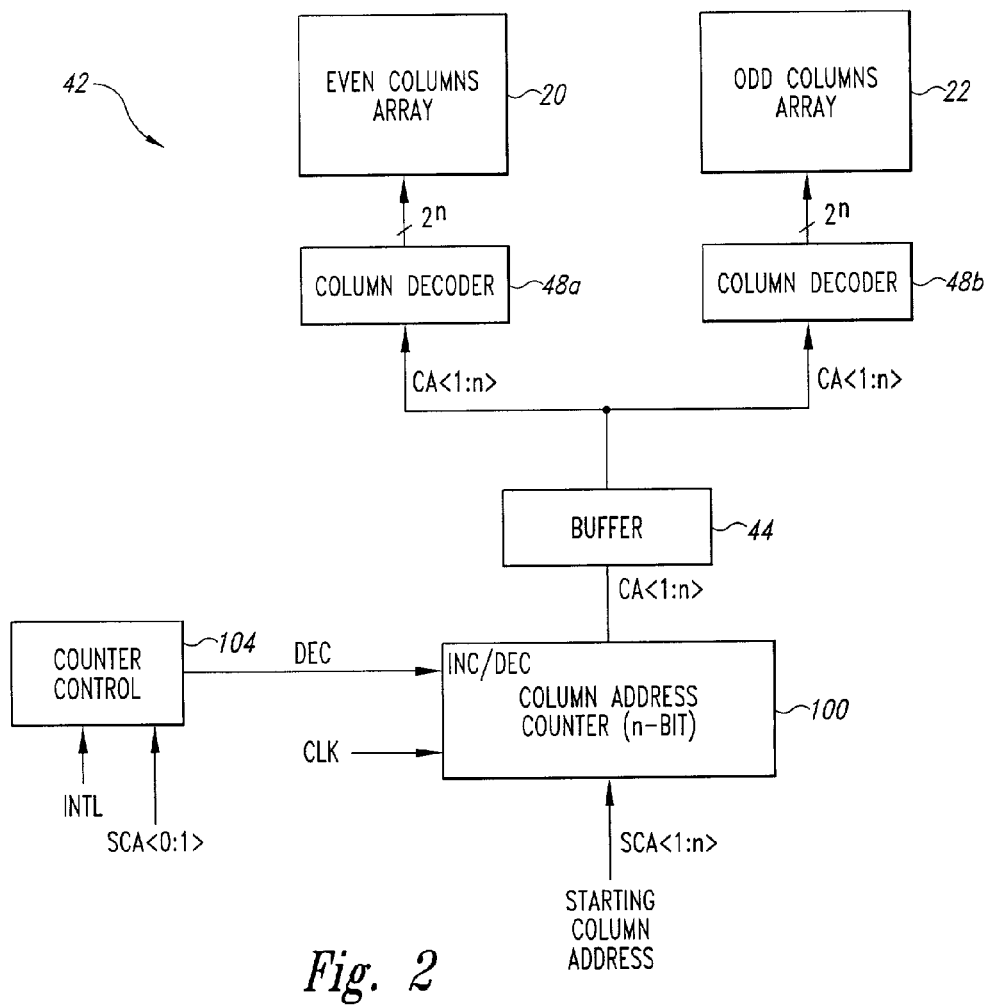
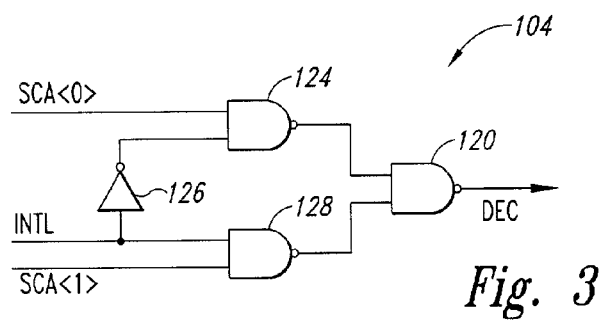
Fig. 2
Fig. 3

BURST COUNTER CONTROLLER AND METHOD IN A MEMORY DEVICE OPERABLE IN A 2-BIT PREFETCH MODE

TECHNICAL FIELD

This invention relates to memory devices, and more particularly, to a burst counter controller and method for more efficiently generating column addresses when the memory device is operating in a burst access mode.

BACKGROUND OF THE INVENTION

Memory devices, such as dynamic random access memories ("DRAMs") contain a large number of memory cells arranged in arrays having rows and columns. A memory cell is selected by a row address and a column address. The row address designates the row of the array containing the selected memory cell, and the column address designates the column of the array containing the selected memory cell. A series of memory cells can be selected by sequentially applying respective addresses to the memory device. However, it requires a significant period of time to decode and process each memory address, thereby slowing the rate at which the memory cells in the series can be selected. Furthermore, the need to generate a respective address to access each memory cell also slows the rate at which memory cells can be accessed and increases the processing overhead of circuitry interfacing with the memory device.

To avoid or at least alleviate the above-described problems, various modes have been devised to avoid the need to provide a row address and a column address for each memory access. For example, in a "page mode" access to a DRAM, a single row address is applied to the DRAM to select a row or "page" of memory cells. A sequence of column addresses is then applied to the DRAM to select a corresponding sequence of memory cells in respective columns in the selected row.

Although page mode memory accesses have the advantage of eliminating the need for a respective row address to access each of the memory cells except for the first memory cell, the time required to decode and process each column address nevertheless requires a significant amount of time. To eliminate the need to apply a column address to the memory device to access each memory cell, "burst mode" memory devices have been developed. In a burst mode memory device, such as a burst mode DRAM, a starting row address and a starting column address are applied to the DRAM. The DRAM then activates the row of memory cells corresponding to the row address and internally generates a sequence of column addresses to access respective memory cells in the activated row. Burst access modes significantly increase the rate at which data may be read from or written to a memory device.

Burst mode memory devices initially operated by serially accessing the memory cells in an active row. However, with the advent of synchronous DRAM ("SDRAMs") having two separately addressable arrays of memory cells, interleave memory accesses were introduced. In interleave memory accesses, the memory addresses increment by toggling the least significant bit ("LSB") every address, toggling the next to least significant bit ("NLSB") every other address, toggling the next most significant bit every fourth address, etc. To further increase memory access speeds, a 2-bit prefetch mode of operation was developed. In the 2-bit prefetch mode of operation, the LSB of an address is ignored, and corresponding columns in respective arrays are thus simultaneously accessed using the address designated by all but the LSB of the column address. The column that is accessed in each array is thus designated by the NLS and higher bits and, as a practical matter, should be the same for both arrays so that corresponding columns in both arrays are simultaneously accessed.

As explained in greater detail below, the burst mode addressing sequence for a memory device is different in the interleave mode than it is in the serial mode. Furthermore, the difficulties of accommodating both the serial mode and the interleave mode are exacerbated by operation in the 2-bit prefetch mode. In the 2-bit prefetch mode, a memory cell in an odd memory array (normally designated by an odd address) and a memory cell in an even memory array (normally designated by an even address) should be simultaneously accessed. In such cases, as previously explained, the least significant bit ("LSB") of a starting memory address is ignored because the LSB normally designates either an even memory array or an odd memory array.

The sequence of column addresses that should be generated starting at an initial, externally applied column address of "$CA_N \ldots CA_2, CA_1, CA_0$" (where "$CA_0$" is the LSB, "$CA_1$" is the NLSB, and "$CA_N \ldots CA_2$" are higher order bits) are shown below (ignoring the bits that are higher order than $CA_3$). The address sequence for an interleave mode with a starting column address of "0 1 1 0" is as follows:

"0 1 1 0" (starting column address)
"0 1 1 1"
"0 1 0 0"
"0 1 0 1"
"0 0 1 0"
"0 0 1 1"
"0 0 0 0"
"0 0 0 1"

The address sequence for an interleave mode with a starting column address of "0 1 0 1" is as follows:

"0 1 0 1" (starting column address)
"0 1 0 0"
"0 1 1 1"
"0 1 1 0"
"1 0 0 1"
"1 0 0 0"
"1 0 1 1"
"1 0 1 0"

The address sequence for a serial mode with a starting column address of "0 1 1 0" is as follows:

"0 1 1 0" (starting column address)
"0 1 1 1"
"1 0 0 0"
"1 0 0 1"
"1 0 1 0"
"1 0 1 1"
"1 1 0 0"
"1 1 0 1"

In all cases, the LSB in all of the above examples is ignored by the memory devices, as previously explained. In each of the above examples, the NLS and higher bits select the same column in each pair of addresses, and the LSB is effectively "0" for the even array and "1" for the odd array. For example, the first pair of column addresses in the interleave mode with a starting column address of "0 1 1 0" selects a column in both arrays having a NLSB (i.e., an effective LSB) of "1", and the second pair of column addresses selects a column in both arrays having a NLSB (i.e., an effective LSB) of "0."

In all of the above cases, the sequence of column addresses can be generated by an incrementing a burst counter that generates only the NLSB and all bits more significant than the NLSB since the LSB is ignored by the counter. Note, however, a problem that develops in the serial mode where the starting column address is "0 1 0 1":

"0 1 0 1" (starting column address)
"0 1 1 0"
"0 1 1 1"
"1 0 0 0"
"1 0 0 1"
"1 0 1 0"
"1 0 1 1"
"1 1 0 0"

In this case, the NLSB selects a different column in each pair of column addresses. For example, the "0" NLSB bit of the first column address in the first pair of addresses selects a column in one array designated by an address ending in "0" and the "1" NLSB bit of the second column address in the first pair of addresses selects a column in the other array designated by an address ending in "1." Similarly, the "1" NLSB bit of the first column address in the second pair of addresses selects a column in one array designated by an address ending in "1" and the "0" NLSB bit of the second column address in the second pair of addresses selects a column in the other array designated by an address ending in "0." As a result, the two bits of accessed data are stored in different columns of the arrays, thus making it difficult to subsequently access the same two bits of data.

Similarly, in the interleave mode with a starting column address of "0 0 1 1" the address sequence must be as follows:

"0 0 1 1" (starting column address)
"0 0 1 0"
"0 0 0 1"
"0 0 0 0"
"0 1 1 1"
"0 1 1 0"
"0 1 0 1"
"0 1 0 0"

The above address sequence cannot be generated by a serial increment of a burst counter since the addresses in the above sequence (again, ignoring the LSB) do not increment. Thus, an interleave sequence for certain starting addresses cannot be generated in the 2-bit prefetch mode by simply incrementing a burst counter.

Conventional burst mode 2-bit prefetch memory devices capable of operating in either a serial mode or an interleave mode generally require two different burst mode counters, one of which is used in the serial mode and the other of which is used in the interleave mode. The need for separate burst accessing circuitry for each of these two burst modes significantly increases the cost of memory devices operating in these two modes.

There is therefore a need for a burst mode column addressing circuit and method for a 2-bit prefetch memory device that can operate in both a serial mode and an interleave mode thereby eliminating the need for separate addressing and counting circuitry for each mode.

SUMMARY OF THE INVENTION

A burst counter method and circuit is used for addressing a memory device capable of operating in 2-bit prefetch mode in either or both of a serial mode and an interleave mode. A column address counter generates all but the least significant bit ("LSB") of a series of column addresses starting at an externally applied initial address. In the interleave mode, a counter control circuit causes the column address counter to increment responsive to decoding a logic "0" value for the next to least significant bit ("NLSB") of the initial column address, and to decrement responsive to decoding a logic "1" value for the NLSB of the initial column address. In the serial mode, the counter control circuit causes the column address counter to increment responsive to decoding a logic "0" value for the LSB of the initial column address, and to decrement responsive to decoding a logic "1" value for the LSB of the initial column address.

BRIEF DESCRIPTION OF THE DRAWINGS

FIG. 2 is a block diagram of a portion of a burst mode counter usable in the memory device of FIG. 1 according to one embodiment of the invention.

FIG. 3 is a logic diagram of one embodiment of a counter control device used in the burst mode counter portion shown in FIG. 2.

DETAILED DESCRIPTION OF THE INVENTION

Figure 1:
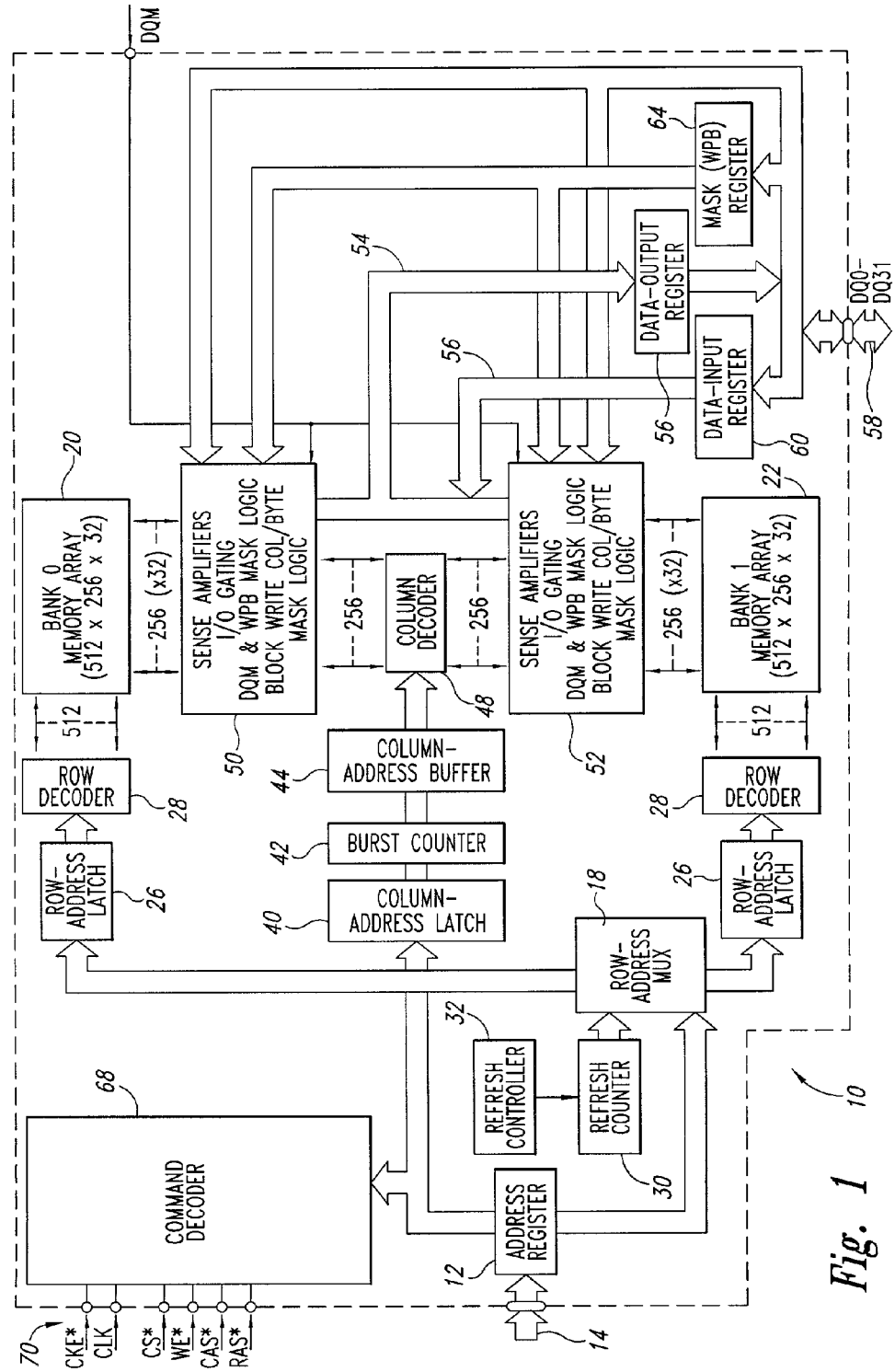
FIG. 1 is a block diagram of a memory device including a burst mode counter according to one embodiment of the invention.

A memory device that may use a burst mode counter according to one embodiment of the invention is shown in FIG. 1. The memory device illustrated therein is a synchronous dynamic random access memory ("SDRAM") 10, although the invention can be embodied in other types of DRAMs, such as packetized DRAMs and RAMBUS DRAMs ("RDRAMS"), as well as other types of memory devices, such as static random access memories ("SRAMs"). The SDRAM 10 includes an address register 12 that receives either a row address or a column address on an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory banks 20, 22 depending upon the state of a bank address bit forming part of the row address. Associated with each of the memory banks 20, 22 is a respective row address latch 26 which stores the row address, and a row decoder 28 which applies various signals to its respective array 20 or 22 as a function of the stored row address. The row address multiplexer 18 also couples row addresses to the row address latches 26 for the purpose of refreshing the memory cells in the arrays 20, 22. The row addresses are generated for refresh purposes by a refresh counter 30, which is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is used for either of two purposes. First, in a normal operating mode, the column address is coupled through a burst counter 42 to a column address buffer 44 to select a column of memory cells in one or both of the memory arrays 20, 22. Second, in a burst operating mode, the column address is coupled to the burst counter 42 and used as a starting column address ("SCA"). The burst counter then generates a sequence of column addresses starting at the SCA, and applies the sequence of column addresses to the column address buffer 44. In either case, the column address buffer 44 applies a column address to a column decoder 48 for each array 20, 22. The column decoders 48 apply respective decoded column addresses to respective sense amplifiers and associated column circuitry 50, 52 for the respective arrays 20, 22.

Data to be read from one of the arrays 20, 22 is coupled to the column circuitry 50, 52 for one of the arrays 20, 22, respectively. The data is then coupled through a read data path 54 to a data output register 56, which applies the data to a data bus 58. Data to be written to one of the arrays 20, 22 is coupled from the data bus 58 through a data input register 60 and a write data path 62 to the column circuitry 50, 52 where it is transferred to one of the arrays 20, 22, respectively. A mask register 64 may be used to selectively alter the flow of data into and out of the column circuitry 50, 52, such as by selectively masking data to be read from the arrays 20, 22.

The above-described operation of the SDRAM 10 is controlled by a command decoder 68 responsive to command signals received on a control bus 70. These high level command signals, which are typically generated by a memory controller (not shown in FIG. 1), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 68 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

The read data path 54 from the column circuitry 50, 52 to the data output register 56 includes one or more pairs of complimentary input/output ("I/O") lines (not shown in FIG. 1) that couple data from a sense amplifier (not shown) for each column in each array 20, 22, respectively. The sense amplifier in the column circuitry 50, 52 for an addressed column receives complimentary signals from a pair of complimentary digit lines. The digit lines are, in turn, coupled to a pair of the complimentary I/O lines by column addressing circuitry. Each pair of I/O lines is selectively coupled by a pair of complimentary data lines to the complimentary inputs of a DC sense amplifier (not shown) included in the read data path 54. The DC sense amplifier, in turn, outputs data to the data output register 56, which is coupled to output or "DQ" terminals of the memory device 10.

One embodiment of a portion of the burst counter 42, which is shown in FIG. 2, includes a column address counter 100 and counter control circuit 104. The column address counter 100 and the counter control circuit 104 are shown in FIG. 2 along with the column address buffer 44, column address decoders 48a,b, and memory arrays 20, 22 used in the SDRAM 10 of FIG. 1. The operation of the burst counter 42 is based on the realization that the correct sequence of column addresses can be generated in the 2-bit prefetch serial mode by decrementing the column address counter whenever the LSB of the externally applied starting column address SCA<0> is a "1." The operation of the burst counter 42 is further based on the realization that the correct sequence of column addresses can be generated in the 2-bit prefetch interleave mode by decrementing the column address counter whenever the NLSB of the externally applied starting column address SCA<1> is a "1."

For example, in the serial mode using the above example of a starting column address of "1 1 0 1" the correct sequence is:

"1 1 0 1" (starting column address)
"1 1 0 0"
"1 0 1 1"
"1 0 1 0"
"1 0 0 1"
"1 0 0 0"
"0 1 1 1"
"0 1 1 0"

Again, ignoring the LSB, it can be seen that the above sequence consists of a decrementing count, and that the column address for each pair of addresses is the same for both the even and the odd addresses in each pair.

In the interleave mode, the correct sequence of column addresses for a starting column address of "1 0 1 1" is as follows:

"1 0 1 1"
"1 0 1 0"
"1 0 0 1"
"1 0 0 0"
"0 1 1 1"
"0 1 1 0"
"0 1 0 1"
"0 1 0 0"

Again ignoring the LSB, it can be see that the above sequence consists of a decrementing count in which the bits toggle correctly for an interleave sequence as explained above, and that the column address for each pair of addresses is the same for both the even and the odd addresses in each pair.

Returning, now, to FIG. 2, the burst counter 42 implements the above principle of operation by controlling the count direction of the column address counter 100 using the counter control circuit 104 based on an INTL signal and the two least significant bits SCA<0:1> of the externally applied starting column address SCA<N:0>. The INTL signal is active high in the interleave mode and inactive low in the serial mode. The column address counter 100 receives SCA<N:1>, i.e., all but the LSB of the starting column address SCA<N:0>, from the column address latch 40 (FIG. 1) or other circuit. The counter circuit 100 generates a sequence of multi-bit column addresses CA<N:1> responsive to a clock signal CLK. The first of these multi-bit column addresses CA<N:1> consists of all but the LSB of the starting column address SCA<N:0> that was initially applied to the counter 100. Thus, the LSB of the column addresses CA<N:1> corresponds to the NLSB of the starting column address SCA<N:0>.

As previously mentioned, the count direction of the column address counter 100 is controlled by the counter control circuit 104. The counter control circuit 104 generates a DEC signal that is active high to cause the counter control circuit 104 to decrement responsive to the CLK signal whenever the LSB of the starting address, i.e., SCA<0>, is "1" when operating in the serial mode. The counter control circuit 104 also generates a logic "1" DEC signal whenever the NLSB of the starting address, i.e., SCA<1>, is "1" when operating in the interleave mode. In all other cases, the counter control circuit 104 generates a logic "0" DEC signal, which causes the column address counter 100 to increment.

By using a single counter that can either increment or decrement, and by controlling the count direction of the counter responsive to the state of the LSB in the serial mode and responsive to the state of the NLSB in the interleave mode, the embodiments of the invention are able to generate the proper column address sequences without the need for separate address sequence generators for the serial and interleave modes.

One embodiment of the counter control circuit 104 is shown in FIG. 3. The counter control circuit 104 generates an active "1" DEC signal at the output of a NAND gate 120 whenever either of the inputs to the NAND gate 120 is low. The first input to the NAND gate 120 will be low whenever a NAND gate 124 decodes a high LSB of the starting column address SCA<0> and a high output from an inverter 126, which occurs whenever INTL is low indicative of operation in the serial mode. The second input to the NAND gate 120 will be low whenever another NAND gate 128 decodes a high NLSB of the starting column address SCA<1> and an active high INTL signal indicative of operation in the interleave mode. Thus, the NAND gate 120 will generate an active high DEC signal whenever the LSB of the starting column address is "1" when operating in the serial mode or whenever the NLSB of the starting column address is "1" when operating in the interleave mode.

Figure 4:
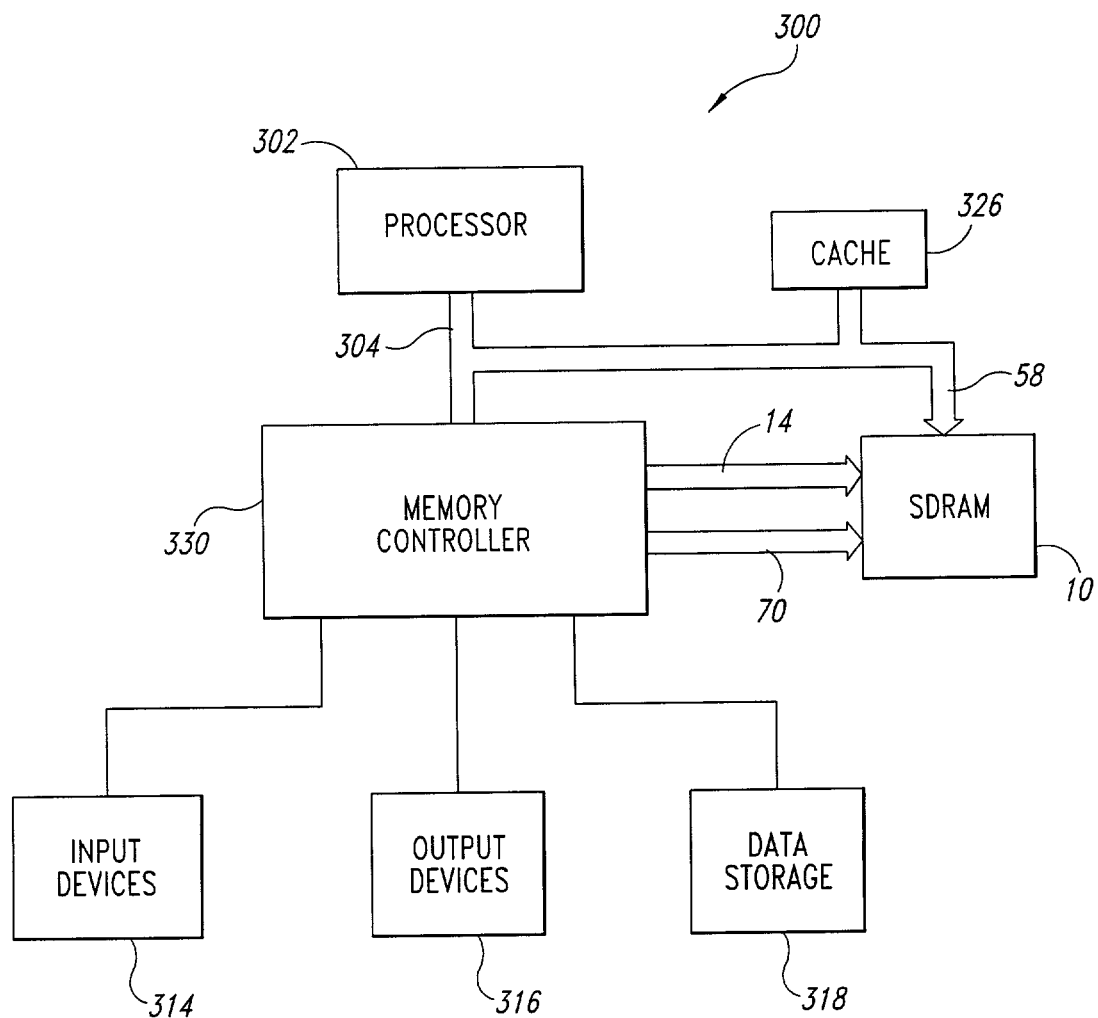
FIG. 4 is a block diagram of a computer system using the memory device of FIG. 1 containing an embodiment of a burst mode counter in accordance with the invention.

The portion of the burst counter 42 shown in FIGS. 2 and 3 can be used in the SDRAM 10 shown in FIG. 1, and the resulting SDRAM 10 can be used in a computer system, such as a computer system shown in FIG. 4. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such as output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 10 through a memory controller 330. The memory controller 330 normally includes a control bus 336 and an address bus 338 that are coupled to the SDRAM 10. A data bus 340 is coupled from the SDRAM 10 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. For example, although the burst counter in accordance with the invention has been explained in the context of an SDRAM 10 having 2 memory arrays 20, 22 and a 2-bit prefetch, it will be understood that other embodiments of the invention may be used with memory devices having a greater number of memory arrays and/or operating to prefetch a number of bits greater than two. Other variations will also be apparent to one skilled in the art. Accordingly, the invention is not limited except as by the appended claims.

What is claimed is:

1. A burst mode counter for use with a 2-bit prefetch memory device having an odd memory array designated by an odd column address and an even memory array designated by an even column address, the burst mode counter comprising:
   a pre-settable column address counter changing count responsive to a clock signal, the counter having a starting count input receiving all but the least significant bit of a starting column address from which the counter increments or decrements, the counter further including a counter control input terminal receiving a counter control signal having a first value causing the counter to increment responsive to the clock signal or a second value causing the counter to decrement responsive to the clock signal; and
   a counter control circuit receiving a mode signal having a first value indicative of a serial mode of operation and a second value indicative of an interleave mode of operation, the counter control circuit further receiving the least significant bit ("LSB") and the next to least significant bit ("NLSB") of the starting column address, the counter control circuit being operable to decode a value of "1" for the LSB and the first value of the mode signal and to generate the second value of the counter control signal responsive thereto, to decode a value of "1" for the NLSB and the second value of the mode signal and to generate the second value of the counter control signal responsive thereto, and to generate the first value of the counter control signal responsive to decoding other values of the LSB, NLSB and the mode signal.

2. The burst mode counter of claim 1 wherein the counter control circuit comprises a logic circuit.

3. The burst mode counter of claim 2 wherein the logic circuit comprises:
   a first logic gate receiving the LSB of the starting column address and a signal indicative of the state of the mode signal;
   a second logic gate receiving the NLSB of the starting column address and a signal indicative of the state of the mode signal; and
   a third logic gate receiving respective outputs from the first and second logic gates.

4. A burst mode counter for use with a 2-bit prefetch memory device having an odd memory array designated by an odd column address and an even memory array designated by an even column address, the memory device being operable in a serial mode, the burst mode counter comprising:
   a pre-settable column address counter changing count responsive to a clock signal, the counter having a starting count input receiving all but the least significant bit of a starting column address from which the counter increments or decrements, the counter further including a counter control input terminal receiving a counter control signal having a first value causing the counter to increment responsive to the clock signal or a second value causing the counter to decrement responsive to the clock signal; and
   a counter control circuit receiving the least significant bit ("LSB") of the starting column address, the counter control circuit being operable to generate the second value of the counter control signal responsive to a value of "1" for the LSB, and to generate the first value of the counter control signal responsive to a value of "0" for the LSB.

5. The burst mode counter of claim 4 wherein the counter control circuit comprises a logic circuit.

6. A dynamic random access memory ("DRAM"), comprising:
an even array of memory cells arranged in rows and columns;
an odd array of memory cells arranged in rows and columns;
a row decoder coupled to receive a row address and being operable to activate a row of memory cells corresponding to the row address;
a column address decoder coupled to receive a column address and to select a column of memory cells in each array corresponding to the column address;
a data path coupled between the memory arrays and a data bus;
a command decoder operable to receive memory commands from a command bus and to generate control signals corresponding to respective memory commands;
a pre-settable burst counter changing count responsive to a clock signal, the burst counter having a count input receiving all but the least significant bit of a column address from which the counter increments or decrements, the burst counter further including a counter control input terminal receiving a counter control signal having a first value causing the burst counter to increment responsive to the clock signal or a second value causing the burst counter to decrement responsive to the clock signal; and
a counter control circuit receiving a mode signal having a first value indicative of a serial mode of operation and a second value indicative of an interleave mode of operation, the counter control circuit further receiving the least significant bit ("LSB") and the next to least significant bit ("NLSB") of the column address, the counter control circuit being operable to decode a value of "1" for the LSB and the first value of the mode signal and to generate the second value of the counter control signal responsive thereto, to decode a value of "1" for the NLSB and the second value of the mode signal and to generate the second value of the counter control signal responsive thereto, and to generate the first value of the counter control signal responsive to decoding other values of the LSB, NLSB and the mode signal.

7. The DRAM of claim 6, wherein the DRAM comprises a synchronous DRAM.

8. The DRAM of claim 6 wherein the counter control circuit comprises a logic circuit.

9. The DRAM of claim 8 wherein the logic circuit comprises:
a first logic gate receiving the LSB of the column address and a signal indicative of the state of the mode signal;
a second logic gate receiving the NLSB of the column address and a signal indicative of the state of the mode signal; and
a third logic gate receiving respective outputs from the first and second logic gates.

10. A dynamic random access memory ("DRAM") operable in a serial mode, the DRAM, comprising:
an even array of memory cells arranged in rows and columns;
an odd array of memory cells arranged in rows and columns;
a row decoder coupled to receive a row address and being operable to activate a row of memory cells corresponding to the row address;
a column address decoder coupled to receive a column address and to select a column of memory cells in each array corresponding to the column address;
a data path coupled between the memory arrays and a data bus;
a command decoder operable to receive memory commands from a command bus and to generate control signals corresponding to respective memory commands; and
a pre-settable burst counter changing count responsive to a clock signal, the burst counter having a count input receiving all but the least significant bit of a column address from which the counter increments or decrements, the burst counter further including a counter control input terminal receiving a counter control signal having a first value causing the burst counter to increment responsive to the clock signal or a second value causing the burst counter to decrement responsive to the clock signal; and
a counter control circuit receiving the least significant bit ("LSB") of the column address, the counter control circuit being operable to generate the second value of the counter control signal responsive to a value of "1" for the LSB, and to generate the first value of the counter control signal responsive to a value of "0" for the LSB.

11. The DRAM of claim 10, wherein the DRAM comprises a synchronous DRAM.

12. The DRAM of claim 10 wherein the counter control circuit comprises a logic circuit.

13. A computer system, comprising:
computer circuitry operable to perform computing functions;
at least one input device coupled to the computer circuitry;
at least one output device coupled to the computer circuitry;
at least one data storage devices coupled to the computer circuitry; and
a dynamic random access memory, comprising
an even array of memory cells arranged in rows and columns;
an odd array of memory cells arranged in rows and columns;
a row decoder coupled to receive a row address and being operable to activate a row of memory cells corresponding to the row address;
a column address decoder coupled to receive a column address and to select a column of memory cells in each array corresponding to the column address;
a data path coupled between the memory arrays and a data bus;
a command decoder operable to receive memory commands from a command bus and to generate control signals corresponding to respective memory commands;
a pre-settable burst counter changing count responsive to a clock signal, the burst counter having a count input receiving all but the least significant bit of a column address from which the counter increments or decrements, the burst counter further including a counter control input terminal receiving a counter control signal having a first value causing the burst counter to increment responsive to the clock signal or a second value causing the burst counter to decrement responsive to the clock signal; and a counter control circuit receiving a mode signal having a first value indicative of a serial mode of operation and a second value indicative of an interleave mode of operation, the counter control circuit further receiving the least significant bit ("LSB") and the next to least significant bit ("NLSB") of the column address, the counter control circuit being operable to decode a value of "1" for the LSB and the first value of the mode signal and to generate the second value of the counter control signal responsive thereto, to decode a value of "1" for the NLSB and the second value of the mode signal and to generate the second value of the counter control signal responsive thereto, and to generate the first value of the counter control signal responsive to decoding other values of the LSB, NLSB and the mode signal.

14. The computer system of claim 13, wherein the DRAM comprises a synchronous DRAM.

15. The computer system of claim 13 wherein the counter control circuit comprises a logic circuit.

16. The computer system of claim 15 wherein the logic circuit comprises:
a first logic gate receiving the LSB of the column address and a signal indicative of the state of the mode signal;
a second logic gate receiving the NLSB of the column address and a signal indicative of the state of the mode signal; and
a third logic gate receiving respective outputs from the first and second logic gates.

17. A computer system, comprising:
computer circuitry operable to perform computing functions;
at least one input device coupled to the computer circuitry;
at least one output device coupled to the computer circuitry;
at least one data storage devices coupled to the computer circuitry; and
a dynamic random access memory operable in a serial mode, the dynamic random access memory comprising an even array of memory cells arranged in rows and columns;
an odd array of memory cells arranged in rows and columns;
a row decoder coupled to receive a row address and being operable to activate a row of memory cells corresponding to the row address;
a column address decoder coupled to receive a column address and to select a column of memory cells in each array corresponding to the column address;
a data path coupled between the memory arrays and a data bus;
a command decoder operable to receive memory commands from a command bus and to generate control signals corresponding to respective memory commands; and
a pre-settable burst counter changing count responsive to a clock signal, the burst counter having a count input receiving all but the least significant bit of a column address from which the counter increments or decrements, the burst counter further including a counter control input terminal receiving a counter control signal having a first value causing the burst counter to increment responsive to the clock signal or a second value causing the burst counter to decrement responsive to the clock signal; and
a counter control circuit receiving the least significant bit ("LSB") of the column address, the counter control circuit being operable to generate the second value of the counter control signal responsive to a value of "1" for the LSB and to generate the first value of the counter control signal responsive to a value of "0" for the LSB.

18. The computer system of claim 17, wherein the DRAM comprises a synchronous DRAM.

19. The computer system of claim 17 wherein the counter control circuit comprises a logic circuit.

20. A method of burst-mode addressing a 2-bit prefetch memory device operable in either a serial mode or an interleave mode, comprising:
in the serial mode, incrementing a column address from a starting column address when a least significant bit ("LSB") of the starting column address is a logic "0";
in the serial mode, decrementing a column address from the starting column address when the LSB of the starting column address is a logic "1";
in the interleave mode, incrementing a column address from the starting column address when a next to least significant bit ("NLSB") of the starting column address is a logic "0"; and
in the interleave mode, decrementing a column address from the starting column address when the NLSB of the starting column address is a logic "1".

21. A method of burst-mode addressing a 2-bit prefetch memory device operable in a serial mode, comprising:
incrementing a column address from a starting column address when a least significant bit ("LSB") of the starting column address is a logic "0"; and
decrementing a column address from the starting column address when the LSB of the starting column address is a logic "1".

22. A method of controlling a burst counter for a memory device operable in a 2-bit prefetch mode, the method comprising:
in a serial operating mode, controlling the count direction of the burst counter responsive to the state of the least significant bit ("LSB") of a starting column address; and
in an interleave operating mode, controlling the count direction of the burst counter responsive to the state of the next to least significant bit ("NLSB") of the starting column address.

23. The method of claim 22 wherein the act of controlling the count direction of the burst counter responsive to the LSB in the serial operating mode comprises:
incrementing a column address from the starting column address when the LSB is a logic "0"; and
decrementing a column address from the starting column address when the LSB is a logic "1".

24. The method of claim 22 wherein the act of controlling the count direction of the burst counter responsive to the NLSB in the interleave operating mode comprises:
incrementing a column address from the starting column address when the NLSB is a logic "0"; and
decrementing a column address from the starting column address when the NLSB is a logic "1".

* * * * *